United States Patent
Joo et al.

(10) Patent No.: US 6,188,244 B1
(45) Date of Patent: Feb. 13, 2001

(54) HYSTERESIS INPUT BUFFER

(75) Inventors: Yang-Sung Joo, Seoul; Joon-Hwan Oh, Euiwang, both of (KR)

(73) Assignee: Hyundai Electronics Industries Co., Ltd., Kyoungki-Do (KR)

( * ) Notice: Under 35 U.S.C. 154(b), the term of this patent shall be extended for 0 days.

(21) Appl. No.: 09/159,759

(22) Filed: Sep. 24, 1998

(30) Foreign Application Priority Data

Oct. 1, 1997 (KR) ................................. 97-50720

(51) Int. Cl.[7] .................. H03K 19/0175; H03K 19/094; H03K 3/037

(52) U.S. Cl. .............................. 326/83; 326/86; 326/87; 326/23; 326/24; 326/112; 326/119; 326/121; 327/205; 327/206

(58) Field of Search .................. 326/24, 23, 86, 326/87, 83, 112, 119, 121; 327/205, 206

(56) References Cited

U.S. PATENT DOCUMENTS

| 4,258,272 |   | 3/1981  | Huang .              |
|-----------|---|---------|----------------------|
| 5,349,246 | * | 9/1994  | McClure ....... 307/443 |
| 5,426,386 | * | 6/1995  | Matthews et al. ...... 327/63 |
| 5,594,361 | * | 1/1997  | Campbell ........ 326/24 |
| 5,654,645 | * | 8/1997  | Lotfi ............ 326/24 |
| 5,977,796 | * | 11/1999 | Gabara ........... 326/83 |

* cited by examiner

Primary Examiner—Michael Tokar
Assistant Examiner—Vibol Tan

(57) ABSTRACT

An hysteresis input buffer includes a first CMOS inverter generating a node signal, a second CMOS inverter coupled to the first CMOS inverter, inverting the node signal from the first CMOS inverter, and producing an intermediate signal, and a hysteresis control circuit coupled to the second CMOS inverter, receiving the intermediate signal, and producing an output signal having a low level during a predetermined delay time and a high level after the predetermined delay time has elapsed.

22 Claims, 6 Drawing Sheets

HYSTERESIS INPUT BUFFER

BACKGROUND OF THE INVENTION

1. Field of the Invention

This invention relates to a hysteresis input buffer and, more particularly, to a hysteresis input buffer for providing an adequate noise margin and a high speed response depending on the characteristics of an input signal.

2. Discussion of Related Art

Conventional input buffers are used in semiconductor integrated circuits to control the transfer time or voltage level of input signals externally received from an outside source. The conventional input buffers transform the TTL (Transistor Transistor Logic) levels of the input signals into CMOS (Complementary Metal-Oxide Semiconductor) levels for use in the integrated circuits.

The conventional input buffers are generally constructed by inverters connected in multistages, and especially by CMOS inverters each formed with a PMOS transistor and an NMOS transistor connected in series between a supply voltage terminal and the ground. If there is an even number of CMOS inverters connected in series (forming an even number of stages), it is possible to transform the voltage level of the input signals to a desired level without inverting the input signals, depending on the driving capabilities of the CMOS inverters. If an odd number of the CMOS inverters are connected in series (forming an odd number of stages), the input signals are inverted by the CMOS inverters.

Although the conventional input buffers can be structured in many different ways, two buffer types—inverter type CMOS input buffers and hysteresis input buffers—are generally used. The inverter type CMOS input buffers are CMOS input buffers connected in two stages and the hysteresis input buffers are inverter type CMOS input buffers manifesting hysteresis characteristics.

FIGS. 1(a) and 2(a) show examples of the inverter type CMOS input buffer and the hysteresis input buffer, respectively. FIG. 1(a) shows a circuit of a conventional inverter type CMOS input buffer and FIG. 1(b) shows a characteristic curve of the input/output of the buffer of FIG. 1(a).

As shown in FIG. 1(a), the inverter type CMOS input buffer includes first and second CMOS inverters INV1 and INV2. These inverters INV1 and INV2 are connected in series to each other wherein the inverter INV1 represents the input stage of the buffer and the inverter INV2 represents the output stage of the buffer. The CMOS inverter INV1 includes a PMOS transistor Q1 and an NMOS transistor Q2 connected in series with their drains connected to an output node N1. A supply voltage VDD terminal is coupled to the source of the PMOS transistor Q1, and the source of the NMOS transistor Q2 is grounded by the ground voltage VSS terminal. Although not shown in the drawings, the CMOS inverter INV2 has the same configuration as the inverter INV1.

When an input signal IN transiting from a high level to a low level is input to the buffer, the PMOS transistor Q1 is turned on and a current path is established between the supply voltage VDD terminal and the output node N1. The current supplied by the supply voltage VDD raises the voltage of the output node N1 and the voltage at the node N1 is inverted by the inverter INV2. With a low level input signal IN, the buffer generates a low level output signal OUT.

When the input signal IN transits from a low level to a high level, the PMOS transistor Q1 is turned off, the NMOS transistor Q2 is turned on, and a current path is established between the output node N1 and the ground terminal. Current flows to the ground terminal and decreases the voltage VN1 at the output node N1. At this time the input signal IN is in a high level and the voltage VN1 is in a low level. The low level node voltage VN1 is inverted by the inverter INV2. As a result, with a high level input signal IN, the buffer generates a high level output signal OUT. The input signal IN and the output signal OUT of the conventional buffer in FIG. 1(a) then have the same voltage levels at a given time.

Depending on the threshold levels of the CMOS transistors used in the conventional input buffer, the logical value of the input signal changes. Parameters for setting the threshold levels of conventional CMOS transistors include a high level input voltage VIH and a low level input voltage VIL. The high level input voltage VIH is defined to be the minimum value of a voltage range recognized by a CMOS inverter as the high level. The low level input voltage VIL is defined to be the maximum value of a voltage range recognized by a CMOS inverter as the low level.

In the input/output characteristic curve shown in FIG. 1(b), the high level input voltage VIH and the low level input voltage VIL for the conventional buffer as shown in FIG. 1(a) are located where the input voltage VIN has the unity gain of one (1). The input voltage VIN is the voltage of the input signal IN.

A further discussion on the operation of the conventional CMOS inverter INV1 in accordance with the parameters VIH and VIL is as follows.

When the level of the input voltage VIN is between the low level input voltage VIL and the ground voltage, the node voltage VN1 becomes high and is input to the CMOS inverter INV2. When the level of the input voltage VIN is between the high level input voltage VIH and the supply voltage VDD, the voltage VN1 becomes low and is input to the inverter INV2. The inverter IN2 inverts the voltage VN1 to generate the output signal OUT.

By properly setting the values of the low and high level input voltages VIL and VIH in both CMOS inverters INV1 and INV2, the output voltage range of the CMOS inverter INV1 can be modified in accordance with the voltage range allowed by the CMOS inverter INV2. However, if noise is provided to these CMOS inverters so that the input voltage level VIN fluctuates, the voltage VIN also fluctuates and an unstable output signal OUT is generated from the CMOS inverter INV2. For example, if the input voltage VIN is slightly lower than or equal to the low level input voltage VIL and noise is mixed into the voltage VIN to momentarily increase the voltage VIN to a level higher than the voltage VIL, an undesired low level (instead of a high level) voltage VN1 and a high level output signal OUT will be generated. That is, with a low level input voltage VIN, a high level output signal OUT is generated which is contrary to the expected output level. Therefore, the conventional inverter type CMOS input buffer as described above has a problem of instability for use in integrated circuits (ICs) which require extremely high reliability.

In order to solve this problem of noise in the conventional inverter type CMOS input buffer, an input buffer having hysteresis characteristics is used. FIG. 2(a) shows a circuit of a conventional hysteresis input buffer and FIG. 2(b) shows hysteresis curves for the input/output of the buffer shown in FIG. 2(a).

As shown in FIG. 2(a), a conventional hysteresis input buffer includes a CMOS inverter INV3 at the input stage and a CMOS inverter INV4 at the output stage. The CMOS inverter INV3 includes a PMOS transistor Q3 and an NMOS transistor Q4 connected to each other in series wherein the supply voltage VDD is applied to the PMOS transistor Q3 and the NMOS transistor Q4 is connected to the ground voltage VSS. The CMOS inverter INV3 also includes a PMOS transistor Q5 and an NMOS transistor Q6 which are connected to each other in series, similar to the structure of PMOS and NMOS transistors Q3 and Q4. The transistors Q3 and Q4 are connected in parallel with the transistors Q5 and Q6 between the supply voltage VDD terminal and the ground voltage VSS terminal. All the drains of the transistors Q3–Q6 are connected together at an output node N2.

The gates of the PMOS and NMOS transistors Q3 and Q4 are controlled by the input signal IN and the gates of the PMOS and NMOS transistors Q5 and Q6 are controlled by the output signal OUT of the CMOS inverter INV4. In other words, the hysteresis characteristic is implemented by controlling the PMOS and NMOS transistors Q5 and Q6 with a feedback output signal of the CMOS inverter INV4.

As shown in FIG. 2(b), the characteristic curve (1) is realized by selectively turning on the transistors Q3 and Q4 only, which is equivalent to the circuit of FIG. 1(a). The characteristic curve (2) is realized when the input voltage VIN transits from a high level to a low level, and the characteristic curve (3) is realized when the input voltage VIN transits from a low level to a high level.

When the input voltage VIN is in a low level (VIN≦VIL), the NMOS transistor Q4 is turned off and the PMOS transistor Q3 is turned on, whereby a current path is established between the supply voltage VDD terminal and the node N2. Voltage at the node N2 (i.e., VN2) increases to a high level by the current from the voltage VDD terminal and the CMOS inverter INV4 inverts the high level voltage VN2 to a low level output signal OUT. The low level output signal OUT is then fed back to the inverter INV3, turning on the PMOS transistor Q5 and turning off the NMOS transistor Q6. The turned-on PMOS transistors Q3 and Q5 establish a current path between the voltage VDD terminal and the output node N2.

In this state, if the input voltage VIN transits from the low level to a high level and fluctuates to a level higher than the high level input voltage VIH, the PMOS transistor Q3 is turned off and the NMOS transistor Q4 is turned on. Since the PMOS transistor Q5 was already turned on by the previous output signal OUT, a current path is created between the supply voltage VDD terminal and the ground VSS terminal through the transistors Q4 and Q5.

Here, the amount of current provided to the node N2 is determined by the current driving capabilities of the transistors Q4 and Q5. If the NMOS transistor Q4 and the PMOS transistor Q5 have the same current driving power (i.e., they have the same W/L (width/length) ratio of the channel), the amount of current provided to the node N2 through the PMOS transistor Q5 and to the ground through the NMOS transistor Q4 become the same such that the node voltage VN2 equals VDD/2. If the current driving capability of the pull down transistor, e.g., the NMOS transistor Q4 or Q6, is higher than that of the pull up transistor, e.g., the PMOS transistor Q3 or Q5, the potential at the node N2 can be pulled down.

If the input voltage VIN is higher than the high level input voltage VIH2 of the characteristic curve (3) in FIG. 2(b), the node voltage VN2 will be below than the logical threshold voltage of the CMOS inverter INV4. As a result, a high level output signal OUT is generated to turn on the NMOS transistor Q6 and the current driving capability of the pull down transistor improves.

In this state, if the input voltage VIN transits from the high level to a low level and becomes lower than the low level input voltage VIL, the PMOS transistor Q3 is turned on and the NMOS transistor Q4 is turned off. Since the NMOS transistor Q6 was already turned on by the output signal OUT, the drain current of the NMOS transistor Q6 equals the drain current of the PMOS transistor Q3. A current path between the supply voltage VDD terminal and the ground is created through the transistors Q3 and Q6 and the node voltage VN2 remains at VDD/2

If the input voltage VIN decreases continuously and is lower than the low level input voltage VIL1, the amount of current supplied to the node N2 through the PMOS transistor Q3 becomes larger than the amount of current provided to the ground through the NMOS transistor Q6. This raises the node voltage VN2 as shown in FIG. 2(b).

If the node voltage VN2 is raised continuously and is greater than the logical threshold voltage of the CMOS inverter INV4, the output signal OUT transits to a low level. This turns on the PMOS transistor Q5 and turns off the NMOS transistor Q6. At this time, both PMOS transistors Q3 and Q5 are turned on. Therefore, current provided from the supply voltage VDD terminal through the PMOS transistors Q3 and Q5 increases extremely rapidly which raises the node voltage VN2.

As discussed hereinabove, when the input voltage VIN transits to a high level, the node voltage VN2 follows curve (3) in FIG. 2(b) with parameters of low and high level input voltages VIL2 and VIH2. When the input voltage VIN transits from a high level to a low level, the node voltage VN2 follows curve (2) with parameters of low and high level input voltages VIL1 and VIH1. The curve (1) is realized by selectively turning on the transistors Q3 and Q4. The conventional input buffer of FIG. 2(a) manifests the hysteresis characteristic as shown in FIG. 2(b).

Since the hysteresis characteristic of the conventional input buffer changes the ranges of the low and high level input voltages depending on the direction of transitions in the input signal (i.e., high to low level, or low to high level), the conventional hysteresis input buffer offers a large noise resistance margin. At the same time, however, a large swing width of the input voltage VIN results in realizing this hysteresis characteristic. This increases the transfer time of the input and output signals such that a high speed input/output operation can not be carried out using the above-described conventional hysteresis input buffer. Therefore, an input buffer with a superior noise resistance which is capable of conducting high speed operations is needed for use in semiconductor integrated circuits requiring high stability and high speed operations.

SUMMARY OF THE INVENTION

Accordingly, the present invention is directed to an input buffer having a hysteresis characteristic that substantially obviates one or more of the problems due to limitations and disadvantages of the related art.

An object of the present invention is to provide a hysteresis input buffer with a preferred noise resistance characteristic and/or performing a high speed operation corresponding to input signals by controlling a feedback path of the output signals in the output stage of the hysteresis input buffer.

To achieve these and other objects of the present invention, the hysteresis input buffer may include a first CMOS inverter generating a node signal; a second CMOS inverter coupled to the first CMOS inverter, inverting the node signal from the first CMOS inverter, and producing an intermediate signal; and a hysteresis control circuit coupled to the second CMOS inverter, receiving the intermediate signal, and producing an output signal having a low level during a predetermined delay time and a high level after the predetermined delay time has elapsed.

Briefly described, the present invention is directed to a buffer including an input buffer circuit receiving an input signal and generating an intermediate signal having a hysteresis characteristic; and a control circuit coupled to the input buffer circuit and controlling the hysteresis characteristic of the intermediate signal by feeding back an output signal of the control circuit to the input buffer circuit.

It is understood that both the foregoing general description and the following detailed description are exemplary and explanatory and are intended to provide a further explanation of the invention as claimed.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed descriptions.

BRIEF DESCRIPTION OF THE ATTACHED DRAWINGS

The accompanying drawings, which are included to provide a further understanding of the invention and which are incorporated in and constitute a part of this specification, illustrate embodiments of the invention and together with the description serve to explain the principles of the invention, wherein.

DETAILED DESCRIPTION OF PREFERRED EMBODIMENTS

Reference will now be made in detail to the preferred embodiments of the present invention, examples of which are illustrated in the accompanying drawings.

Figure 3:
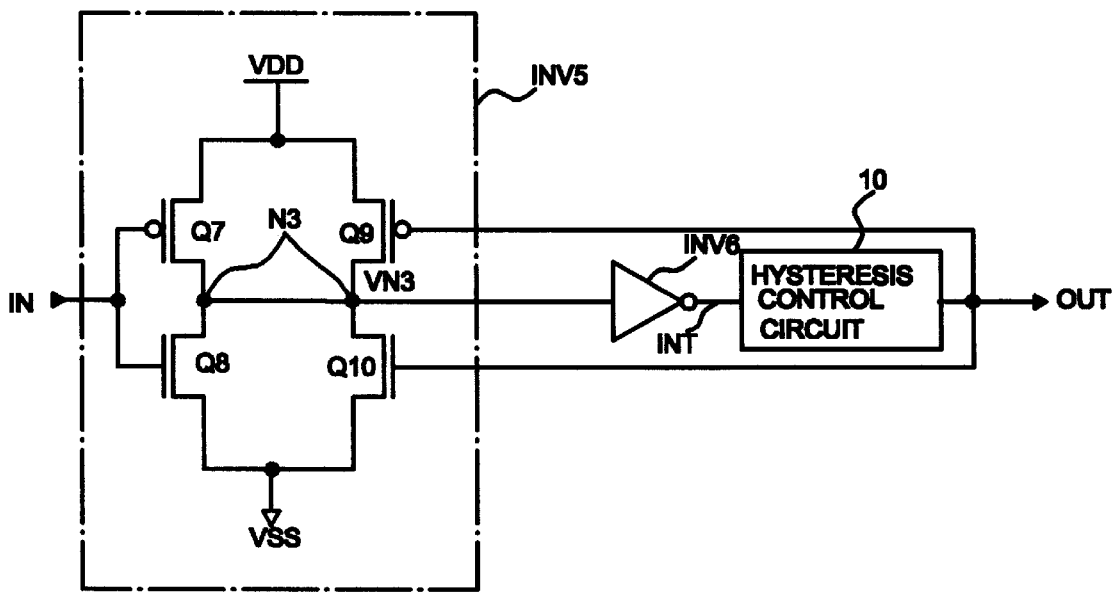
FIG. 3 shows a circuit of a hysteresis input buffer according to an embodiment of the present invention.

FIG. 3 shows a hysteresis input buffer according to an embodiment of the present invention. As shown therein, the hysteresis input buffer includes a CMOS inverter INV5, a CMOS inverter IN6, and a hysteresis control circuit 10. The CMOS inverter INV5 includes a PMOS transistor Q7 and an NMOS transistor Q8 connected to each in series where the supply voltage VDD is applied to the source of the PMOS transistor Q7 and the source of the NMOS transistor Q8 is connected to the ground voltage VSS terminal. PMOS transistor Q9 and NMOS transistor Q10 are connected in parallel with the PMOS transistor Q7 and the NMOS transistor Q8 between the supply voltage VDD terminal and the ground voltage VSS terminal. The drains of these transistors Q7–Q10 are connected to each other at node N3 of the inverter INV5.

The gates of the PMOS transistor Q7 and NMOS transistor Q8 are controlled by the input signal IN and the gates of the PMOS transistor Q9 and NMOS transistor Q10 are controlled by the output signal OUT of the hysteresis control circuit 10. The signal from the node N3 is inverted by the inverter INV6 and applied to the hysteresis control circuit 10 as an intermediate signal INT. The output signal OUT of the hysteresis control circuit 10 is fed back to the gates of the PMOS transistor Q9 and the NMOS transistor Q10 to implement a hysteresis characteristic.

Figure 4A:
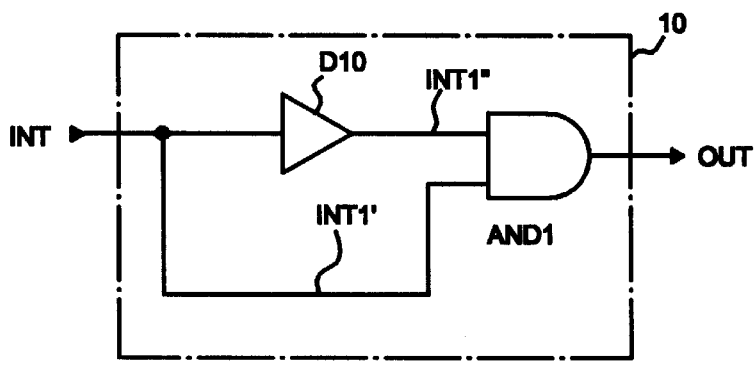
FIG. 4(a) shows an example of a hysteresis control circuit of the hysteresis input buffer in FIG. 3 according to the present invention.
Figure 4B:
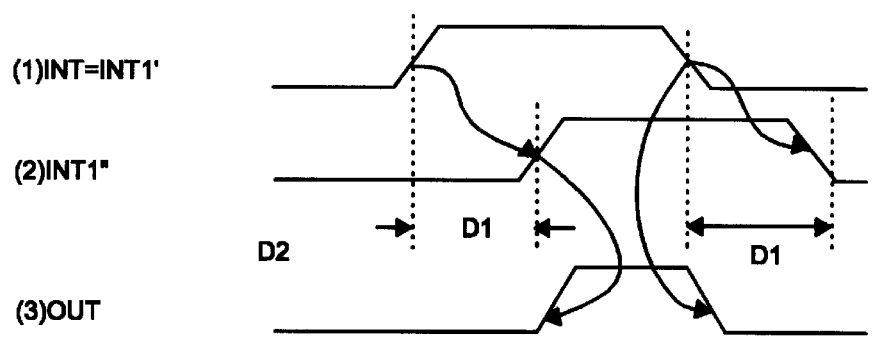
FIG. 4(b) shows a timing diagram representing the input and output characteristics of the hysteresis control circuit in FIG. 4(a) according to the present invention.

The hysteresis control circuit 10 can be structured with many different elements in accordance with the characteristics of the input signal IN. FIG. 4(a) shows one example of the hysteresis control circuit 10 and FIG. 4(b) shows timing diagrams representing the input and output characteristics of the hysteresis control circuit 10. Although FIG. 4(a) shows only one example of the hysteresis control circuit 10, it is contemplated that other types of hysteresis control circuits can be used in the present invention.

As shown in FIG. 4(a), the hysteresis control circuit includes a buffer D10 and an AND-gate AND1. The intermediate signal INT of the CMOS inverter INV6 is input to the AND-gate AND1 and to the buffer D10, directly. The buffer D10 produces a first input signal INT1" which is equivalent to the intermediate signal INT delayed with a predetermined time delay $\tau \leq D1$. The intermediate signal INT directly input to the AND-gate AND1 is known as a second input signal INT1'.

The waveform (1) in FIG. 4(b) represents the second input signal INT1' provided directly to the AND-gate AND1 and the waveform (2) represents the first input signal INT1" provided to the gate AND1 via the buffer D10. The waveform (3) shows the output signal OUT of the hysteresis input buffer in FIG. 3.

As shown in FIG. 4(b), when the intermediate signal INT transits from a low level to a high level (which means the input signal INT1' transits to a high level), the output signal OUT remains in the low level as long as the input signal INT1" is in the low level for a delay time $\tau \leq D1$ of the buffer D10. After the delay time $\tau \leq D1$ has elapsed and as the input signal INT" transits to a high level, the output signal OUT transits to a high level.

The high output signal OUT transits to a low level at the same time as the high intermediate signal INT transits to a low level. That is, the output signal OUT responds immediately to the high-to-low transition in the input signal INT'.

The hysteresis input buffer including the hysteresis control circuit 10 of FIG. 4(a) according to the embodiments of the present invention operates as follows. First, when an input voltage VIN of the input signal IN is in the low level (VIN≦VIL), the NMOS transistor Q8 is turned off and the PMOS transistor Q7 is turned on so that a current path is established between the supply voltage VDD terminal and the node N3. Current is provided to the node N3 through the PMOS transistor Q7 which raises the node voltage VN3 at the node N3 to a high level.

The high level node voltage VN3 is inverted to a low level by the CMOS inverter INV6 and applied to the hysteresis control circuit 10 as the low intermediate signal INT as shown in FIG. 4(b). The hysteresis control circuit 10 which received the low intermediate signal INT generates a low level output signal OUT immediately, without any time delay, in accordance with the above-described operation. The low level output signal OUT turns on the PMOS transistor Q9.

With both PMOS transistors Q7 and Q9 turned on, the node N3 is pulled up. In this state, if the input voltage VIN transits from the low level to a level higher than the high level input voltage VIH, the PMOS transistor Q7 is turned off and the NMOS transistor Q8 is turned on. Since the NMOS transistor Q8 was already turned on by the high level input voltage VIN, a current path between the supply voltage VDD terminal and the ground voltage VSS terminal is established through the NMOS and PMOS transistors Q8 and Q9.

At this time, the amount of current provided to the node N3 is determined by the W/L ratio of the PMOS transistor Q9 and the NMOS transistor Q8. If the current driving capabilities of the NMOS transistor Q8 and the PMOS transistor Q9 are the same (e.g., same W/L ratio), the amount of current provided to the node N3 through the PMOS transistor Q9 will equal to the amount of current provided to the ground through the NMOS transistor Q8. Therefore, the voltage at the node N3 (i.e., VN3) is maintained at VDD/2. However, if the current driving capability of the pull down transistor (i.e., the NMOS transistor Q8 or Q10) is higher than the current driving capability of the pull up transistor (i.e., the PMOS transistor Q7 or Q9), the node N3 is pulled down. Therefore, when the input voltage VIN is above the high level input voltage VIH2 of the characteristic curve (3) shown in FIG. 2(b), the node voltage VN3 will be lower than the logical threshold voltage of the CMOS inverter INV6 and the intermediate signal INT will transit to a high level.

Figure 1A:
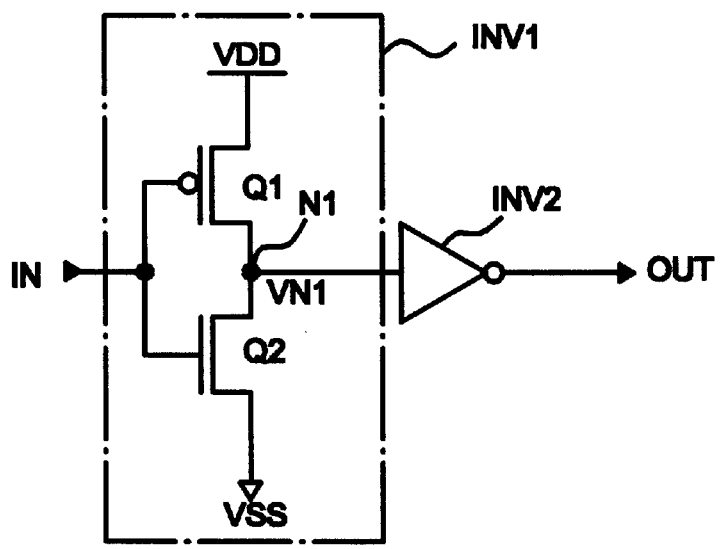
FIG. 1(a) shows a circuit of a conventional inverter type CMOS input buffer.
Figure 1B:
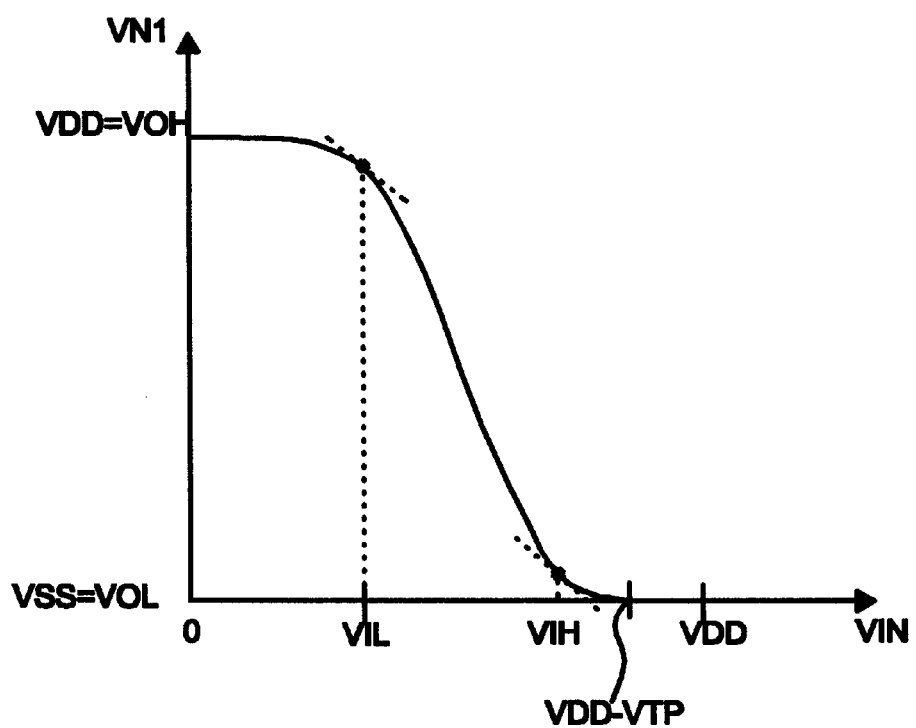
FIG. 1(b) shows a characteristic curve of the input and output of the CMOS input buffer shown in FIG. 1(a)
Figure 2A:
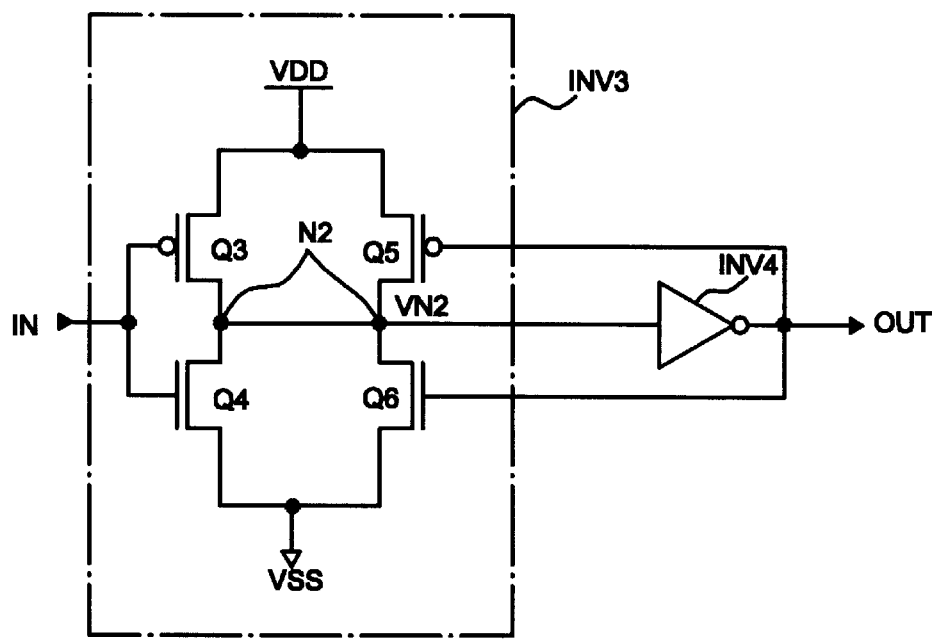
FIG. 2(a) shows a circuit of a conventional hysteresis input buffer.
Figure 2B:
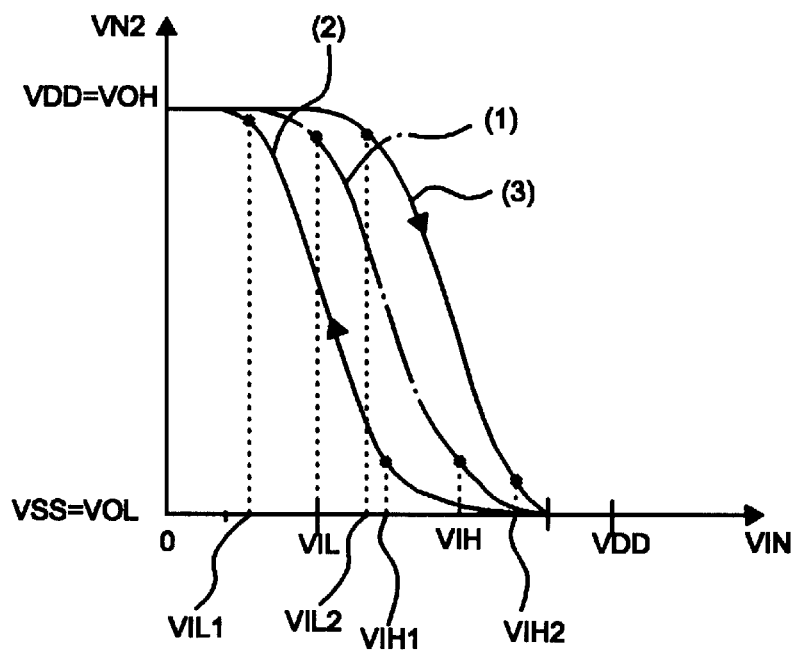
FIG. 2(b) shows a characteristic curve of the input and output of a hysteresis input buffer according to the present invention.

The transition of the intermediate signal INT to a high level results in the transition of the output signal OUT to a high level only after a predetermined delay time $\tau \leq D1$ has elapsed. The high output signal OUT turns off the PMOS transistor Q9 and turns on the NMOS transistor Q10. Therefore, when the input signal IN transits to a high level, the input signal IN after the delay time $\tau \leq D1$ has elapsed could change the logical value of the node N3 only if the conditions of the low level input voltage VIL2 and the high level input voltage VIH2 of the characteristic curve (3) in FIG. 2(b) are satisfied. Under this condition, when the high level input voltage VIN transits to a low level and further diminishes to a level lower than the low level input voltage VIL, the PMOS transistor Q7 is turned on and the NMOS transistor Q8 is turned off. At this time, since the NMOS transistor Q10 was already turned on by the high output signal OUT, the PMOS transistor Q7 and the NMOS transistor Q10 establish a current path between the supply voltage VDD terminal and the ground VSS terminal such that the node voltage VN3 cannot be completely transformed into a CMOS level.

If the input voltage VIN continuously decreases to a level lower than the low level input voltage VIL1, the current driving capability of the PMOS transistor Q7 is improved and the amount of current provided from the PMOS transistor Q7 becomes larger than the amount of current provided to the ground through the NMOS transistor Q10. This raises the node voltage VN3. As the node voltage VN3 increases continuously and becomes higher than the logical threshold voltage of the CMOS inverter INV6, a low level signal INT of the inverter INV6 is input to the hysteresis control circuit 10. The transition in the intermediate signal INT then causes a low level output signal OUT to be generated without any time delay by the hysteresis control circuit 10. The low level output signal OUT then turns off the NMOS transistor 10. Thus, the input signal IN transiting from a high level to a low level needs to satisfy the conditions of the low level input voltage VIL1 and the high level input voltage VIH1 of the characteristic curve (2) in FIG. 2(b) in order to change the logical value of the node N3.

The operation of the above described embodiments of the present invention will now be described. When the input voltage VIN of the input signal IN transits from a low level to a high level (VIN≦VIH2), the output signal OUT still remains in the low level for the delay time $\tau \leq D1$ of a delay means, e.g., the buffer D10. Here, other delay elements or circuits can be employed to provide the delay. The input voltage VIN needs to remain at the high level input voltage VIH2 for a sufficient time before the output signal OUT changes to a high level. As a result, a stable high level output signal OUT is generated and maintained, even if noise is mixed into the input signal IN and the level of the input voltage VIN is varied.

Figure 5:
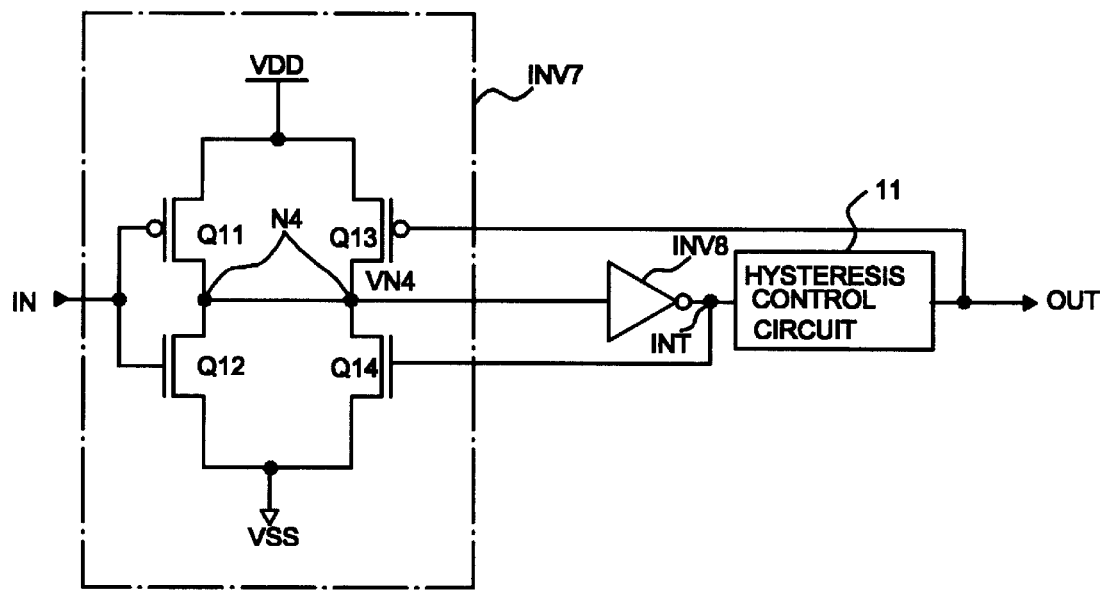
FIG. 5 shows a circuit of a hysteresis input buffer according to another embodiment of the present invention.

FIG. 5. shows a circuit of the hysteresis input buffer according to another embodiment of the present invention. As shown therein, the input buffer includes a CMOS inverter INV7, a CMOS inverter INV8, and a hysteresis control circuit 11. In the CMOS inverter INV7, a PMOS transistor Q11 and an NMOS transistor Q12 are connected in series, a supply voltage VDD is applied to the source of the PMOS transistor Q11, and the source of the NMOS transistor Q12 is connected to the ground voltage VSS. A PMOS transistor Q13 and NMOS transistor Q14 are connected in series to each other and in parallel with the PMOS transistor Q11 and the NMOS transistor Q12 between the supply voltage VDD terminal and the ground voltage VSS terminal. Drains of the transistors Q11–Q14 are connected to each other at an output node N4.

The gates of the PMOS transistor Q11 and the NMOS transistor Q12 are controlled by the input signal IN, and the gates of the PMOS transistor Q13 and the NMOS transistor Q14 are controlled by the output signal OUT of the hysteresis control circuit 11. The output signal of the node N4 is inverted by the CMOS inverter INV8 to generate the intermediate signal INT of the inverter INV8. The signal INT is applied to the hysteresis control circuit 11 and to the gate of the NMOS transistor Q14. The output signal OUT of the hysteresis control circuit 11 is fed back to the gate of the PMOS transistor Q13 for implementing the hysteresis characteristic.

Figure 6A:
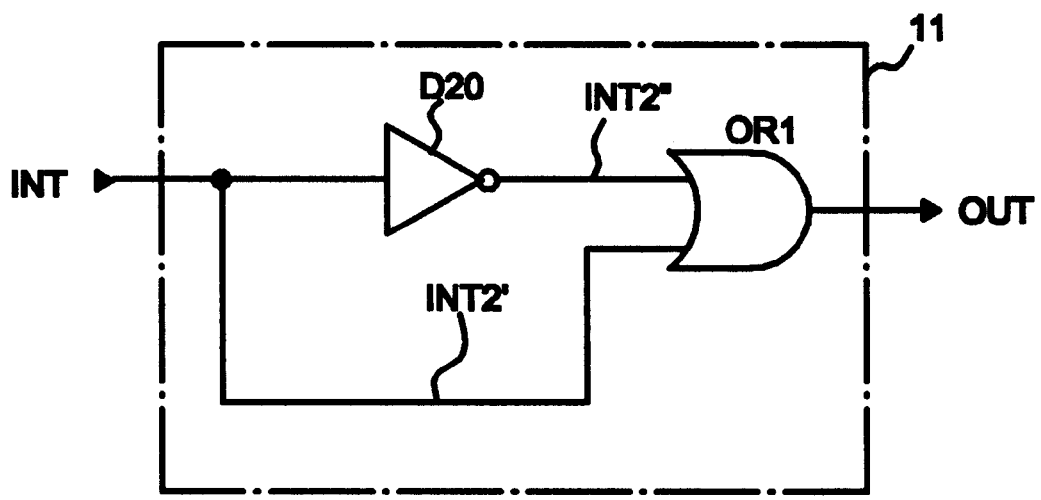
FIG. 6(a) shows an example of a hysteresis control circuit of the hysteresis input buffer in FIG. 5 according to the present invention.
Figure 6B:
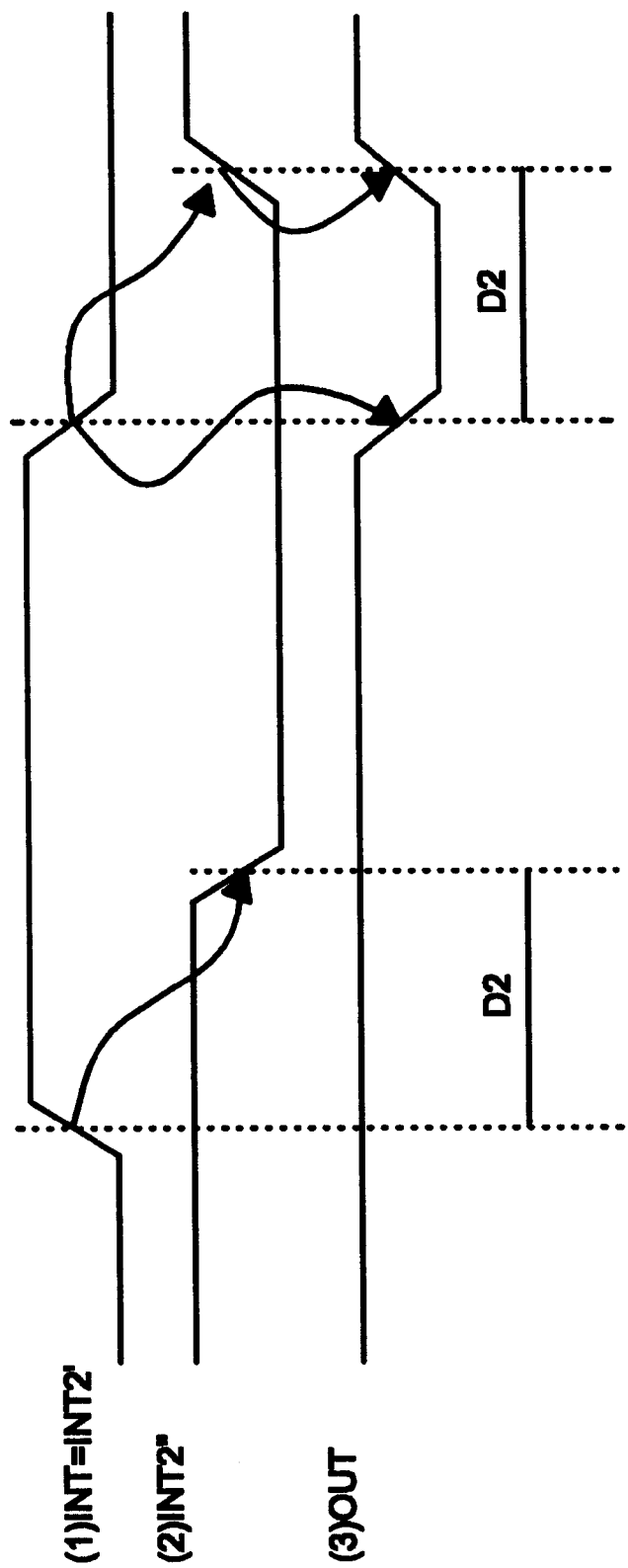
FIG. 6(b) shows a timing diagram representing the input and output characteristics of the hysteresis control circuit in FIG. 6(a) according to the present invention.

FIG. 6(a) shows an example of the hysteresis control circuit 11 according to another embodiment of the present invention and FIG. 6(b) shows a timing diagram representing the input/output characteristics of the hysteresis control circuit 11.

As shown in FIG. 6(a), the intermediate signal INT of the inverter INV8 is applied to an OR-gate OR1 as a first input signal INT2" and as a second input signal INT2'. The first input signal INT2" is generated by delaying the signal INT through the inverter D20 with a predetermined time delay $\tau \leq D1$. The second input signal INT2' is the signal INT applied directly to the OR-gate OR1.

The waveform (1) of FIG. 6(b) shows the second input signal INT2' transmitted directly to the gate OR1, the waveform (2) shows the first input signal INT2" transmitted through the inverter D20, and the waveform (3) shows the output signal OUT of the hysteresis control circuit 11.

As shown in FIG. 6(b), when the intermediate signal INT (or the second input signal INT2') is in a low level, the first input signal INT2" is in a high level and the output signal OUT is in a high level. When the second input signal INT2' transits from the low level to a high level, the first input signal INT2" remains in the high level for a predetermined time $\tau \leq D2$ and then it is inverted to a low level by the inverter D20. During this time the output signal OUT is maintained in the high level continuously.

When the intermediate signal INT transits from the high level to a low level, a low level input signal INT2' is applied to the OR-gate OR1. At this time, the first input signal INT2" remains in the low level and then transits to a high level after the delay time $\tau \leq D2$ has elapsed. During the delay time $\tau \leq D2$ of the inverter D20 after the intermediate signal INT has transited to a low level, both the second and first input signals INT2' and INT2" of the OR-gate OR1 are in the low level which places the output signal OUT in the low level. After the delay time $\tau \leq D2$ has elapsed, the input signal INT2" of the inverter D20 switches to a high level which is applied to the OR-gate OR1. This causes the low output signal OUT to transit to a high level.

The output signal OUT of the hysteresis control circuit 11 is maintained in the low level only during the delay time $\tau \leq D2$ of the inverter D20 immediately after the signal INT transits from a high level to a low level. It is maintained in the high level at other times regardless of the logical value of the signal INT.

The operation of the hysteresis input buffer of FIG. 5 in accordance with the embodied invention will now be described. First, when the input voltage VIN is in a low level (VIN≦VIL), the PMOS transistor Q11 is turned on and the NMOS transistor Q12 is turned off. The turned on PMOS transistor Q11 establishes a current path from the supply voltage VDD terminal to the node N4 wherein the current from the supply voltage VDD is applied to the node N4 to generate a high level voltage VN4 at the node N4.

The high level node voltage N4 is inverted to a low level by the CMOS inverter INV8, turning off the NMOS transistor Q14. The low level intermediate signal INT of the inverter INV8 is then transformed into a high level output signal OUT in the hysteresis control circuit 11 which turns off the PMOS transistor Q13. When both of the PMOS transistor Q13 and the NMOS transistor Q14 for implementing the hysteresis characteristic are turned off as in this case, the input voltage VIN produced thereafter satisfies the conditions of the low and high level input signals VIL and VIH having the characteristic curve (1) of FIG. 2(b).

When the low level input voltage VIN transits to a level above the high level input voltage VIH, the PMOS transistor Q11 is turned off and the NMOS transistor Q12 is turned on, forming a current path between the node N4 and the ground terminal. The node voltage VN4 at the node N4 then transits to a low level and the CMOS inverter INV8 generates a high level intermediate signal INT. The high level intermediate signal INT turns off the NMOS transistor Q14 and is input to the hysteresis control circuit 11.

At this time, the high level signal INT turns off the PMOS transistor Q13 since the hysteresis control circuit 11 generates continuously a high level output signal OUT. Then both of the NMOS transistors Q12 and Q14 are turned on. The input signal IN generated thereafter can change the logical value (voltage VN4) of the node N4 only if the conditions of the low level input voltage VIL2 and the high level input voltage VIH2 of the characteristic curve (3) shown in FIG. 2(b) are satisfied.

In this state, when the input voltage VIN transits again from the high level to a low level and becomes lower than the low level input voltage VIL, the PMOS transistor Q11 is turned on and the NMOS transistor Q12 is turned off. When the input voltage VIN becomes lower than the low level input voltage VIL1, the node voltage VN4 becomes higher than the logical threshold voltage of the CMOS inverter INV8 such that the CMOS inverter INV8 generates a low level intermediate signal INT and the NMOS transistor Q14 is turned off.

Then, just as the intermediate signal INT of the inverter INV8 transits from the high level to a low level, the hysteresis control circuit 11 generates a low level output signal OUT for the delay time of $\tau \leq D2$. The transition in the intermediate signal INT to a low level simultaneously causes the transition in the output signal OUT to a low level. After the delay time has elapsed, the output signal OUT returns to a high level.

In other words, in accordance with the embodiments of the present invention, when the input voltage VIN transits from a low level to a high level, a fast response by the CMOS inverter is provided as the conditions of the low level input voltage VIL and the high level input voltage VIH of the characteristic curve of FIG. 2(b) are satisfied. On the contrary, when the input voltage VIN transits from the high level to a low level, according to the conditions of the low level input voltage VIL1 and the high level input voltage VIH1 of the characteristic curve (2) of FIG. 2(b) during the delay time $\tau \leq D2$ and by turning off the PMOS transistor Q13 after the delay time $\tau \leq D2$, the hysteresis input buffer manifests the input/output characteristics curve (1) shown in FIG. 2(b), producing a fast response of the output to the next input voltage VIN.

Accordingly, the present invention provides a preferred noise margin characteristic or a faster operation characteristic according to the characteristic of the input signal using hysteresis control means (e.g., a hysteresis control circuit) in the output stage of the hysteresis input buffer which controls the feedback path of the output signal. This invention improves the noise resistance characteristic by changing the logical threshold of the input voltage depending on the transition direction of the input signal, and implements a fast response speed and a preferred noise margin characteristic depending on the characteristic of the input signal by controlling the feedback path of the output signal and the hysteresis characteristic.

It is to be understood that the above-described arrangements are simply illustrative of the application of the principles of this invention. Numerous other arrangements may be readily devised by those skilled in the art which embody the principles of the invention and fall within its spirit and scope.

It will be apparent to those skilled in the art that various modifications and variations can be made in an input buffer having a hysteresis characteristic of the present invention without departing from the spirit or scope of the invention. Thus, it is intended that the present invention cover the modifications and variations of this invention provided they come within the scope of the appended claims and their equivalents.

What is claimed is:

1. A buffer comprising:
an input buffer circuit receiving an input signal and generating an intermediate signal having hysteresis characteristic; and
a control circuit coupled to the input buffer circuit and controlling the hysteresis characteristic of the intermediate signal by feeding back an output signal of the control circuit to the input buffer circuit,
wherein the control circuit includes a delay unit delaying a signal input thereto for a predetermined time.

2. A buffer comprising:
an input buffer circuit receiving an input signal and generating an intermediate signal having hysteresis characteristic; and
a control circuit coupled to the input buffer circuit and controlling the hysteresis characteristic of the intermediate signal by feeding back an output signal of the control circuit to the input buffer circuit,
wherein the input buffer circuit includes a differential amplifier.

3. A buffer comprising:
an input buffer circuit receiving an input signal and generating an intermediate signal having hysteresis characteristic; and
a control circuit coupled to the input buffer circuit and controlling the hysteresis characteristic of the intermediate signal by feeding back an output signal of the control circuit to the input buffer circuit,
wherein the control circuit includes an AND-gate and an inverter.

4. A buffer comprising:
an input buffer circuit receiving an input signal and generating an intermediate signal having hysteresis characteristic; and
a control circuit coupled to the input buffer circuit and controlling the hysteresis characteristic of the intermediate signal by feeding back an output signal of the control circuit to the input buffer circuit,
wherein the control circuit includes an OR-gate and an inverter.

5. A buffer comprising:
an input buffer circuit receiving an input signal and generating an intermediate signal having hysteresis characteristic; and
a control circuit coupled to the input buffer circuit and controlling the hysteresis characteristic of the intermediate signal by feeding back an output signal of the control circuit to the input buffer circuit,
wherein the input buffer circuit includes first and second CMOS inverters coupled to each other in series to generate the intermediate signal based on the input signal, and
wherein the intermediate signal is fed back to the first CMOS inverter.

6. A buffer comprising:
an input buffer circuit receiving an input signal and generating an intermediate signal having hysteresis characteristic; and
a control circuit coupled to the input buffer circuit and controlling the hysteresis characteristic of the intermediate signal by feeding back an output signal of the control circuit to the input buffer circuit,
wherein the input buffer circuit includes first and second CMOS inverters coupled to each other in series to generate the intermediate signal based on the input signal, and
wherein the first CMOS inverter includes a first pair of PMOS and NMOS transistors and a second pair of PMOS and NMOS transistors, the gates of the first pair of PMOS and NMOS transistors receiving the input signal, the first and second pairs of PMOS and NMOS transistors coupled to each other in parallel between a voltage terminal and a ground terminal.

7. The buffer according to claim 6, wherein the output signal of the control circuit is fed back to the gates of the second pair of PMOS and NMOS transistors.

8. A buffer comprising:
an input buffer circuit receiving an input signal and generating an intermediate signal having hysteresis characteristic; and
a control circuit coupled to the input buffer circuit and controlling the hysteresis characteristic of the intermediate signal by feeding back an output signal of the control circuit to the input buffer circuit,
wherein the control circuit includes a delay circuit for delaying a transition in the output signal from a low level to a high level for a predetermined time period when the input signal transits from a low level to a high level.

9. A buffer comprising:
an input buffer circuit receiving an input signal and generating an intermediate signal having hysteresis characteristic; and
a control circuit coupled to the input buffer circuit and controlling the hysteresis characteristic of the intermediate signal by feeding back an output signal of the control circuit to the input buffer circuit,
wherein the control circuit includes a delay circuit which responds to a high to low level transition in the input signal to generate the output signal transiting from a high level to a low level.

10. A hysteresis input buffer, comprising:
a first CMOS inverter generating a node signal;
a second CMOS inverter coupled to the first CMOS inverter, inverting the node signal from the first CMOS inverter, and producing an intermediate signal; and
a hysteresis control circuit coupled to the second CMOS inverter, receiving the intermediate signal, and producing an output signal having a low level during a predetermined delay time and a high level after the predetermined delay time has elapsed.

11. The hysteresis input buffer according to claim 10, wherein the hysteresis control circuit includes a delay circuit generating the predetermined delay time.

12. The hysteresis input buffer according to claim 11, wherein the delay circuit includes an inverter for generating the predetermined delay time and capable of inverting a signal input thereto.

13. The hysteresis input buffer according to claim 10, wherein the hysteresis control circuit includes an OR-gate producing a logical sum of a first input signal generated by delaying the intermediate signal of the second CMOS inverter and a second input signal which is the same as the intermediate signal of the second CMOS inverter.

14. The hysteresis input buffer according to claim 10, wherein the hysteresis control circuit includes an AND-gate producing a logical sum of a first input signal generated by delaying the intermediate signal of the second CMOS inverter and a second input signal which equals the intermediate signal of the second CMOS inverter.

15. The hysteresis input buffer according to claim 10, wherein the output of the hysteresis control circuit is fed back to the first CMOS inverter.

16. The hysteresis input buffer according to claim 15, wherein the intermediate signal of the second CMOS inverter is fed back to the first CMOS inverter.

17. A buffer comprising:

a first inverter to invert an input signal;

a second inverter connected to an output of the first inverter; and a control circuit connected to an output of the second inverter, to produce an output signal, wherein at least one of the output of the second inverter and an output of the control circuit is connected to an input of the first inverter.

18. The buffer according to claim 17, wherein the output of the control circuit is connected to the input of the first inverter.

19. The buffer according to claim 17, wherein the output of the second inverter is connected to the input of the first inverter.

20. The buffer according to claim 17, wherein the output signal has a low level during a predetermined delay time and a high level after the predetermined delay time has elapsed.

21. The buffer according to claim 17, wherein the control circuit includes a delay unit delaying a signal input thereto for a predetermined time.

22. The buffer according to claim 21, wherein the delay unit includes a single-input logic gate connected to a two-input logic gate.

* * * * *